US008729690B2

(12) United States Patent
Vindasius et al.

(10) Patent No.: US 8,729,690 B2
(45) Date of Patent: *May 20, 2014

(54) ASSEMBLY HAVING STACKED DIE MOUNTED ON SUBSTRATE

(71) Applicant: Invensas Corporation, San Jose, CA (US)

(72) Inventors: Al Vindasius, Saratoga, CA (US); Marc E. Robinson, San Jose, CA (US); Larry Jacobsen, Bend, OR (US); Donald Almen, San Martin, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/728,246

(22) Filed: Dec. 27, 2012

(65) Prior Publication Data

US 2013/0207249 A1   Aug. 15, 2013

Related U.S. Application Data

(63) Continuation of application No. 11/744,142, filed on May 3, 2007, now Pat. No. 8,357,999, which is a continuation of application No. 11/090,969, filed on Mar. 25, 2005, now Pat. No. 7,215,018.

(60) Provisional application No. 60/561,849, filed on Apr. 13, 2004.

(51) Int. Cl.
*H01L 23/522* (2006.01)

(52) U.S. Cl.
USPC .................. 257/686; 257/777; 257/E23.085

(58) Field of Classification Search
USPC .................. 257/686, 777, E23.085
See application file for complete search history.

(56) References Cited

U.S. PATENT DOCUMENTS

| 3,648,131 A | 3/1972 | Stuby |
| 3,679,941 A | 7/1972 | LaCombe et al. |
| 3,702,025 A | 11/1972 | Archer |

(Continued)

FOREIGN PATENT DOCUMENTS

| DE | 102004039906 A1 | 8/2005 |
| EP | 0314437 A1 | 5/1989 |

(Continued)

OTHER PUBLICATIONS

Advisory Action mailed Oct. 20, 2008, U.S. Appl. No. 11/744,153.

(Continued)

*Primary Examiner* — Phat X Cao
(74) *Attorney, Agent, or Firm* — Lerner, David, Littenberg, Krumholz & Mentlik, LLP (57) ABSTRACT

Metal rerouting interconnects at one or more sides of a die or multiple die segments can form edge bonding pads for electrical connection. Insulation can be applied to surfaces of the die or multiple die segments after optional thinning and singulation, and openings can be made in the insulation to the electrical connection pads. After being placed atop one another in a stack, vertically adjacent die or die segments can be electrically interconnected using a flexible bond wire or bond ribbon attached to an electrical connection pad exposed within such opening, the bond wire or ribbon protruding horizontally, and an electrically conductive polymer, or epoxy, filaments or lines can be applied to the stack.

19 Claims, 6 Drawing Sheets

(56) References Cited

U.S. PATENT DOCUMENTS

| | | |
|---|---|---|
| 4,074,342 A | 2/1978 | Honn et al. |
| 4,323,914 A | 4/1982 | Berndlmaier et al. |
| 4,500,905 A | 2/1985 | Shibata |
| 4,525,921 A | 7/1985 | Carson et al. |
| 4,545,840 A | 10/1985 | Newman et al. |
| 4,646,128 A | 2/1987 | Carson et al. |
| 4,659,931 A | 4/1987 | Schmitz et al. |
| 4,672,737 A | 6/1987 | Carson et al. |
| 4,703,170 A | 10/1987 | Schmitz |
| 4,706,166 A | 11/1987 | Go |
| 4,761,681 A | 8/1988 | Reid |
| 4,764,846 A | 8/1988 | Go |
| 4,801,992 A | 1/1989 | Golubic |
| 4,807,021 A | 2/1989 | Okumura |
| 4,818,823 A | 4/1989 | Bradley |
| 4,827,327 A | 5/1989 | Miyauchi et al. |
| 4,862,249 A | 8/1989 | Carlson |
| 4,894,706 A | 1/1990 | Sato et al. |
| 4,897,708 A | 1/1990 | Clements |
| 4,901,136 A | 2/1990 | Neugebauer et al. |
| 4,939,568 A | 7/1990 | Kato et al. |
| 4,941,033 A | 7/1990 | Kishida |
| 4,953,005 A | 8/1990 | Carlson et al. |
| 4,954,875 A | 9/1990 | Clements |
| 4,956,694 A | 9/1990 | Eide |
| 4,956,695 A | 9/1990 | Robinson et al. |
| 4,959,749 A | 9/1990 | Dzarnoski, Jr. et al. |
| 4,983,533 A | 1/1991 | Go |
| 4,996,583 A | 2/1991 | Hatada |
| 5,006,923 A | 4/1991 | Warren |
| 5,013,687 A | 5/1991 | Solomon |
| 5,019,943 A | 5/1991 | Fassbender et al. |
| 5,025,306 A | 6/1991 | Johnson et al. |
| 5,028,986 A | 7/1991 | Sugano et al. |
| 5,032,896 A | 7/1991 | Little et al. |
| 5,075,253 A | 12/1991 | Sliwa, Jr. |
| 5,093,708 A | 3/1992 | Solomon |
| 5,104,820 A | 4/1992 | Go et al. |
| 5,111,278 A | 5/1992 | Eichelberger |
| 5,117,282 A | 5/1992 | Salatino |
| 5,128,831 A | 7/1992 | Fox, III et al. |
| 5,135,556 A | 8/1992 | Hornback et al. |
| 5,138,437 A | 8/1992 | Kumamoto et al. |
| 5,146,308 A | 9/1992 | Chance et al. |
| 5,172,303 A | 12/1992 | Bernardoni et al. |
| 5,191,405 A | 3/1993 | Tomita et al. |
| 5,198,888 A | 3/1993 | Sugano et al. |
| 5,202,754 A | 4/1993 | Bertin et al. |
| 5,221,642 A | 6/1993 | Burns |
| 5,222,014 A | 6/1993 | Lin |
| 5,229,647 A | 7/1993 | Gnadinger |
| 5,231,304 A | 7/1993 | Solomon |
| 5,247,423 A | 9/1993 | Lin et al. |
| 5,258,330 A | 11/1993 | Khandros et al. |
| 5,270,261 A | 12/1993 | Bertin et al. |
| 5,270,571 A | 12/1993 | Parks et al. |
| 5,279,029 A | 1/1994 | Burns |
| 5,309,326 A | 5/1994 | Minoru |
| 5,311,401 A | 5/1994 | Gates, Jr. et al. |
| 5,313,096 A | 5/1994 | Eide |
| 5,330,359 A | 7/1994 | Walker |
| 5,420,751 A | 5/1995 | Burns |
| 5,422,435 A | 6/1995 | Takiar et al. |
| 5,434,745 A | 7/1995 | Shokrgozar et al. |
| 5,445,994 A | 8/1995 | Gilton |
| 5,446,620 A | 8/1995 | Burns et al. |
| 5,466,634 A | 11/1995 | Beilstein, Jr. et al. |
| 5,479,318 A | 12/1995 | Burns |
| 5,493,476 A | 2/1996 | Burns |
| 5,495,398 A | 2/1996 | Takiar et al. |
| 5,499,160 A | 3/1996 | Burns |
| 5,502,289 A | 3/1996 | Takiar et al. |
| 5,502,333 A | 3/1996 | Bertin et al. |
| 5,538,758 A | 7/1996 | Beach et al. |
| 5,550,711 A | 8/1996 | Burns et al. |
| 5,552,963 A | 9/1996 | Burns |
| 5,566,051 A | 10/1996 | Burns |
| 5,571,754 A | 11/1996 | Bertin et al. |
| 5,600,541 A | 2/1997 | Bone et al. |
| 5,616,953 A | 4/1997 | King et al. |
| 5,625,230 A | 4/1997 | Park et al. |
| 5,657,206 A | 8/1997 | Pedersen et al. |
| 5,675,180 A | 10/1997 | Pedersen et al. |
| 5,688,721 A | 11/1997 | Johnson |
| 5,696,031 A | 12/1997 | Wark |
| 5,698,895 A | 12/1997 | Pedersen et al. |
| 5,724,230 A | 3/1998 | Poetzinger |
| 5,870,351 A | 2/1999 | Ladabaum et al. |
| 5,879,965 A | 3/1999 | Jiang et al. |
| 5,891,761 A | 4/1999 | Vindasius et al. |
| 5,936,302 A | 8/1999 | Pedersen et al. |
| 5,946,545 A | 8/1999 | Bertin et al. |
| 5,994,170 A | 11/1999 | Pedersen et al. |
| 6,080,596 A | 6/2000 | Vindasius et al. |
| 6,098,278 A | 8/2000 | Vindasius et al. |
| 6,107,164 A | 8/2000 | Ohuchi |
| 6,124,633 A | 9/2000 | Vindasius et al. |
| 6,134,118 A | 10/2000 | Pedersen et al. |
| 6,228,686 B1 | 5/2001 | Smith et al. |
| 6,255,726 B1 | 7/2001 | Vindasius et al. |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,338,980 B1 | 1/2002 | Satoh |
| 6,351,030 B2 | 2/2002 | Havens et al. |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,656,827 B1 | 12/2003 | Tsao et al. |
| 6,664,616 B2 | 12/2003 | Tsubosaki et al. |
| 6,667,543 B1 | 12/2003 | Chow et al. |
| 6,674,159 B1 | 1/2004 | Peterson et al. |
| 6,730,997 B2 | 5/2004 | Beyne et al. |
| 6,844,623 B1 | 1/2005 | Peterson et al. |
| 6,908,784 B1 | 6/2005 | Farnworth et al. |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,091,592 B2 | 8/2006 | Chen et al. |
| 7,115,986 B2 | 10/2006 | Moon et al. |
| 7,180,168 B2 | 2/2007 | Imai |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,285,865 B2 | 10/2007 | Kwon et al. |
| 7,355,274 B2 | 4/2008 | Lim |
| 7,535,109 B2 | 5/2009 | Robinson et al. |
| 7,638,869 B2 | 12/2009 | Irsigler et al. |
| 7,662,670 B2 | 2/2010 | Noma et al. |
| 7,768,795 B2 | 8/2010 | Sakurai et al. |
| 7,829,438 B2 | 11/2010 | Haba et al. |
| 7,901,989 B2 | 3/2011 | Haba et al. |
| 8,022,527 B2 | 9/2011 | Haba et al. |
| 8,076,788 B2 | 12/2011 | Haba et al. |
| 8,357,999 B2 * | 1/2013 | Robinson et al. ............ 257/686 |
| 2001/0031548 A1 | 10/2001 | Elenius et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0180025 A1 * | 12/2002 | Miyata et al. ................ 257/690 |
| 2002/0185725 A1 | 12/2002 | Moden et al. |
| 2002/0187260 A1 | 12/2002 | Sheppard et al. |
| 2003/0060034 A1 | 3/2003 | Beyne et al. |
| 2003/0096454 A1 | 5/2003 | Poo et al. |
| 2003/0099085 A1 | 5/2003 | Duva |
| 2003/0122243 A1 | 7/2003 | Lee et al. |

(56) References Cited

U.S. PATENT DOCUMENTS

| | | |
|---|---|---|
| 2003/0209772 A1 | 11/2003 | Prabhu |
| 2004/0065963 A1* | 4/2004 | Karnezos .................. 257/777 |
| 2004/0142509 A1 | 7/2004 | Imai |
| 2004/0150095 A1 | 8/2004 | Fraley et al. |
| 2004/0195667 A1 | 10/2004 | Karnezos |
| 2004/0238933 A1 | 12/2004 | Chen et al. |
| 2005/0067680 A1 | 3/2005 | Boon et al. |
| 2005/0082651 A1 | 4/2005 | Farnworth et al. |
| 2005/0104179 A1 | 5/2005 | Zilber et al. |
| 2005/0148160 A1 | 7/2005 | Farnworth et al. |
| 2005/0230802 A1 | 10/2005 | Vindasius et al. |
| 2005/0248021 A1 | 11/2005 | Morkner |
| 2005/0287705 A1 | 12/2005 | Yang |
| 2006/0055050 A1 | 3/2006 | Numata et al. |
| 2006/0094165 A1 | 5/2006 | Hedler et al. |
| 2006/0121645 A1 | 6/2006 | Ball |
| 2006/0138626 A1 | 6/2006 | Liew et al. |
| 2006/0220262 A1 | 10/2006 | Meyer et al. |
| 2007/0132082 A1 | 6/2007 | Tang et al. |
| 2007/0158807 A1 | 7/2007 | Lu et al. |
| 2007/0181989 A1 | 8/2007 | Corisis et al. |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0166836 A1 | 7/2008 | Jobetto |
| 2008/0308921 A1 | 12/2008 | Kim |
| 2009/0102038 A1 | 4/2009 | McElrea et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0207277 A1 | 8/2010 | Bauer et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2012/0080807 A1 | 4/2012 | Haba et al. |
| 2012/0133057 A1 | 5/2012 | Haba et al. |

FOREIGN PATENT DOCUMENTS

| | | | |
|---|---|---|---|
| EP | 1041624 | A1 | 10/2000 |
| EP | 1763894 | A2 | 3/2007 |
| FR | 2704690 | A1 | 11/1994 |
| JP | 63-056925 | | 3/1988 |
| JP | 64-035528 | | 2/1989 |
| JP | 02-133936 | | 5/1990 |
| JP | 07-509104 | A | 10/1995 |
| JP | 2001210782 | A | 8/2001 |
| JP | 2003163324 | A | 6/2003 |
| JP | 2004153130 | A | 5/2004 |
| JP | 2004158536 | A | 6/2004 |
| WO | 93/23982 | A1 | 11/1993 |
| WO | 9425987 | A1 | 11/1994 |
| WO | 9907015 | A1 | 2/1999 |
| WO | 9909599 | A2 | 2/1999 |
| WO | 0164344 | A2 | 9/2001 |
| WO | 2005081315 | A2 | 9/2005 |
| WO | 2005101492 | A2 | 10/2005 |
| WO | 2009052150 | A1 | 4/2009 |
| WO | 2009114670 | A2 | 9/2009 |

OTHER PUBLICATIONS

Amendment filed in response to Final Office Action mailed Jan. 8, 2007, U.S. Appl. No. 11/097,829.

Apr. 1, 2008 Adt filed in response to Office Action mailed Dec. 31, 2007, U.S. Appl. No. 11/744,153.

Aug. 27, 2006 Amendment filed in response to Office Action mailed Feb. 7, 2006, U.S. Appl. No. 11/097,829.

Aug. 5, 2009 Amendment filed in repsonse to Office Action mailed Jul. 15, 2009, U.S. Appl. No. 11/016,558.

European Search Report relating to EP Application No. 05735136.3 dated Jun. 5, 2008.

Final Office Action mailed Jul. 1, 2008, U.S. Appl. No. 11/744,153.

Final Office Action, mailed Jan. 8, 2007, U.S. Appl. No. 11/087,829.

International Search Report and Written Opinion, PCT/US08/09207, dated Jan. 16, 2009.

International Search Report and Written Opnion, PCT/US2007/021552 dated May 29, 2008.

International Search Report, PCT/US2009/003643, dated Aug. 28, 2009.

Jan. 21, 2011 Amendment filed in response to Office Action mailed Jul. 21, 2010 U.S. Appl. No. 11/849,162.

Nov. 26, 2008 Adt and RCE filed in response to Final Office Action mailed Jul. 1, 2008, U.S. Appl. No. 11/744,153.

Oct. 1, 2008 Adt filed in response to Final Office Action mailed Jul. 1, 2008.

Office Action mailed Dec. 31, 2007, U.S. Appl. No. 11/744,153.

Office Action mailed Feb. 7, 2006, U.S. Appl. No. 11/097,829.

Office Action mailed Jul. 15, 2009, U.S. Appl. No. 11/016,558.

Office Action mailed Jul. 21, 2010, U.S. Appl. No. 11/849,162.

* cited by examiner

FIG. 6

ASSEMBLY HAVING STACKED DIE MOUNTED ON SUBSTRATE

CROSS REFERENCE TO RELATED APPLICATIONS

This application is a Continuation of U.S. application Ser. No. 11/744,142, filed May 3, 2007, which is a Continuation of U.S. application Ser. No. 11/090,969, filed Mar. 25, 2005, which is now U.S. Pat. No. 7,215,018. Said application Ser. No. 11/090,969 claims the benefit of the filing date of U.S. Provisional Application 60/561,849, filed Apr. 13, 2004, the disclosures of each such Application and Provisional Application being incorporated herein by reference.

BACKGROUND OF THE INVENTION

The present invention relates to an apparatus for stacking and interconnecting integrated circuit die and/or multiple die segments of silicon, interconnecting the die and or multiple die segments on the edges of the stack using an electrically conductive polymer or epoxy, and mounting the stack of die on a BGA substrate.

For many years, electrical components such as transistors and integrated circuits have been made using wafers of semiconductor material, including silicon and/or germanium. Integrated circuits have been provided on the wafer using various techniques known as etching, doping, and layering. Individual integrated circuits that are provided on the wafer are referred to as die, and include contact points called bond pads for external electrical connections. Typically, the die on the wafer are separated from one another by cutting the wafer along boundaries defining the die. Once the die are cut from the wafer, they are referred to as chips or die, and are packaged for use. In recent years, the proliferation of more powerful electronic systems has led to an increased need for higher performance and higher density integrated circuit packages.

One method for creating higher density packages attempts to create an entire computer system on a single wafer using wafer scale integration (WSI) techniques. WSI technology attempts to laterally wire together all the die on a wafer using wires to interconnect the die. However, in order to create the necessary interconnections between the die, many wires are required that are extremely thin and difficult to create. Furthermore, the resulting interconnected die occupy a very large area, or footprint, on the electronic systems circuit board onto which the wafer scale integration device is attached for connection into the electronic system.

A second method for creating higher density packages attempts to reduce the area required for placing the chips on a circuit board by physically stacking the chips vertically. One chip stacking technique mounts individual die on ceramic carriers, encapsulates both the die and the carrier, stacks the carriers, and then mounts the stack on a printed circuit board. In this technique, all the die in the stack are interconnected by connecting the leads of the die to the printed circuit board via metal pins. This method results in an unusually high pin count on the circuit board which reduces the reliability of the circuitry because the high pin count increases the possibility that one of the many pins may become disconnected from the board.

Another chip stacking method uses a more complex process to stack die, as disclosed in U.S. Pat. No. 5,104,820 issued Apr. 14, 1992. This method modifies individual chips so that they may be stacked by adding a pattern of metalization, called rerouting leads, to the surface of the wafer. The rerouting leads extend from the bond pads on the chip to newly formed bond pads, and are arranged so that all the rerouting leads terminate on one side of the modified chip. Each modified chip is then cut from the wafer, and assembled into a stack. The stack is assembled in a manner such that all the leads of the modified chips are aligned along the same side of the stack. The side of the stack having the leads is then etched and polished so that a cross section of the leads on each of the modified chips is accessible. After the leads are exposed, a layer of metalization is applied to the leads along the side of the stack in order to electrically connect each of the modified chips in the stack. The stack is then mounted and connected to a substrate which in turn is connected to conventional circuitry.

This method of rerouting leads offers improvement in circuit density over prior methods but is complex and expensive. In addition, the rerouting leads extend over adjacent die, which are destroyed when the modified chip is cut out of the wafer. In this method, multiple die are sacrificed for every chip that is modified.

Another method for creating higher density circuits creates stacks from entire wafers, rather than individual chips, to form a wafer array. In some devices, the wafers in the stack are electrically interconnected using solid vertical columns of metallic conductive feed-throughs, such as copper. The use of solid feed-throughs to interconnect wafers may cause damage to the array due to differential thermal coefficients of expansion during thermal cycles. Furthermore, the process is costly and makes the wafers difficult to separate for repairs.

Other methods also exist to interconnect stacks of wafers, as disclosed in, for example, U.S. Pat. No. 4,897,708 issued Jun. 30, 1990, and U.S. Pat. No. 4,954,875 issued Sep. 4, 1990. These methods provide each wafer in the stack with coned-shaped through-holes which expose bonding pads on the wafers. The bond pads of the wafers in the stack are then electrically connected by either filling the through holes with electrically conductive liquid, or inserting an electrically conductive compliant material into the through holes, to provide a continuous vertical electrical connection between the wafers. While avoiding the disadvantages of using solid vertical columns of metal to interconnect wafers, the use of electrically conductive liquids and conductive materials requires special tooling to fill the through holes. Furthermore, for some applications, it may not be desirable to use stacks of entire wafers due to size constraints of the electrical device.

Individual semiconductor die are typically assembled in packages that allow the integrated circuit die to be attached to printed circuit boards and to allow electrical connections to be made between the integrated circuit die. There are many types of packages that are used for this purpose. The BGA package and the TSOP package are 2 types of packages in common use for assembling memory die and mounting the assembled die on a printed circuit board. There are a number of methods for stacking packaged integrated circuits, but in general, they suffer from a size disadvantage, and a performance disadvantage, due to the added electrical parasitics arising from the necessary lengths and characteristics of the inter-package interconnections. Due to the large physical size of the packages, there is a limit to the number of packages which may be stacked on top of each other, typically 2, to avoid thermo-mechanical problems. Stacks of packaged integrated circuits have been recently popular but take up too much board space, are too thick, and will not operate at the high speeds being required by advanced memory devices such as DDR2 and DDR3 DRAM.

BRIEF SUMMARY OF THE INVENTION

Accordingly, it is an object of the present invention to provide an improved method and apparatus for stacking and interconnecting integrated circuit die and multiple die segments.

An aspect of the invention provides an apparatus for vertically interconnecting semiconductor die, integrated circuit die, or multiple die segments. Metal rerouting interconnects which extend to one or more sides of the die or segment can be optionally added to the die or multi die segment to provide edge bonding pads upon the surface of the die for external electrical connection points. After the metal rerouting interconnect has been added to the die on the wafer, the wafer is optionally thinned and each die or multiple die segment is singulated from the wafer by cutting or other appropriate singulation method. After the die or multiple die segments are singulated or cut from the wafer, insulation is applied to all surfaces of the die or multiple die segments, openings are made in the insulation above the desired electrical connection pads, and the die or multiple die segments are placed on top of one another to form a stack. Vertically adjacent segments in the stack are electrically interconnected by attaching a short flexible bond wire or bond ribbon to the exposed electrical connection pad at the peripheral edges of the die which protrudes horizontally from the die and applying electrically conductive polymer, or epoxy, filaments or lines to one or more sides of the stack.

According to a further aspect of the present invention, a thermally conductive epoxy preformed sheet is provided so that the stack of segments are epoxied together. The thermally conductive epoxy preform includes a plurality of glass spheres randomly distributed within the preform.

The interconnected die stack is then mounted and electrically connected to the top surface of a substrate, consisting of conducting and insulating layers, and having electrical connection points on the top surface of the substrate aligned under the vertical filaments or lines that have been formed along the sides of the die stack, and having solder balls on the bottom of the substrate, or other connection means, for electrically connecting and mounting the bottom of the substrate to a printed circuit board.

Other objects, features and advantages of the present invention will become apparent from the following detailed description when taken in conjunction with the accompanying drawings.

DETAILED DESCRIPTION OF THE INVENTION

Figure 1:
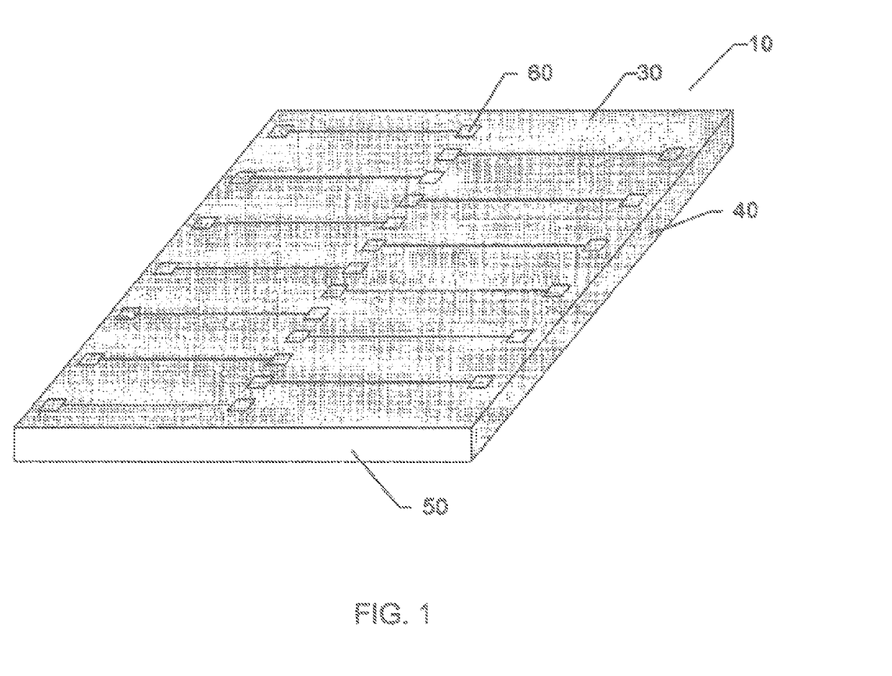
FIG. 1 is a diagram illustrating a single semiconductor die with original connection pads running down the center of the die, and rerouting lines connecting the original connection pads at the center of the die with new connection pads located at the edges of the die.

Referring to FIG. 1, semiconductor die 10, with original connection pads 60 have had an insulating layer applied to the top surface, 30 of all of the die while the die are still connected together in a wafer form. A metal layer is deposited and defined using photolithography, to reroute the electrical signals from the original connection pads 60 to new locations at the edge of the die. An additional layer of insulating material is optionally applied above the metal layer, and openings are made in the top layer of insulating material at the relocated pad locations at the edge of the semiconductor die, and optionally at the original pad locations down the center of the top surface of the die.

Figure 2:
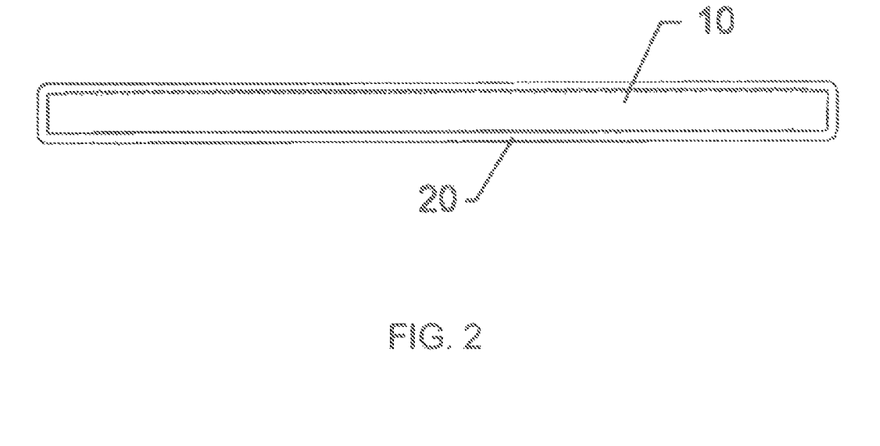
FIG. 2 is a diagram illustrating a cross sectional side view of a semiconductor die showing the die coated with a conformal, insulating coating.

Referring to FIG. 2, the semiconductor die, 10, has been thinned by grinding or lapping, and has been singulated from the semiconductor wafer, and said semiconductor die has been coated with a conformal insulating coating 20.

Figure 3:
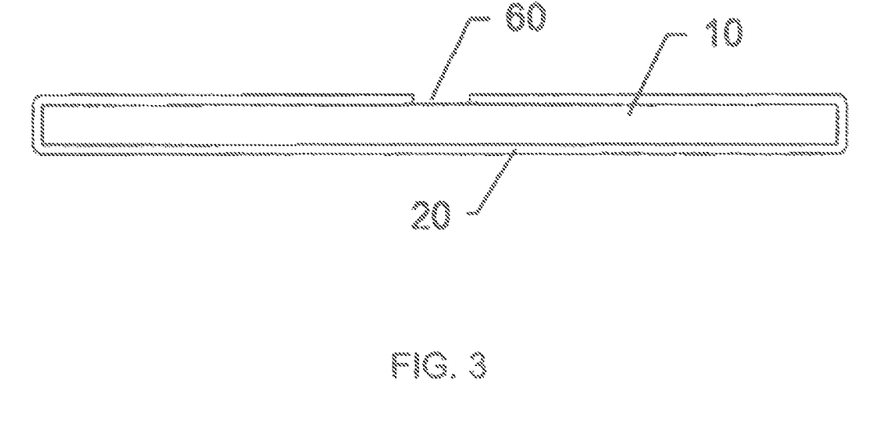
FIG. 3 is a diagram illustrating a cross section view of the semiconductor die showing the conformal coating and openings in the conformal coating above the original connection pads which run down the center of the semiconductor die.

Referring to FIG. 3, openings have been made in the coating, 20, above original connection pads, 60, of semiconductor die, 10.

Figure 4:
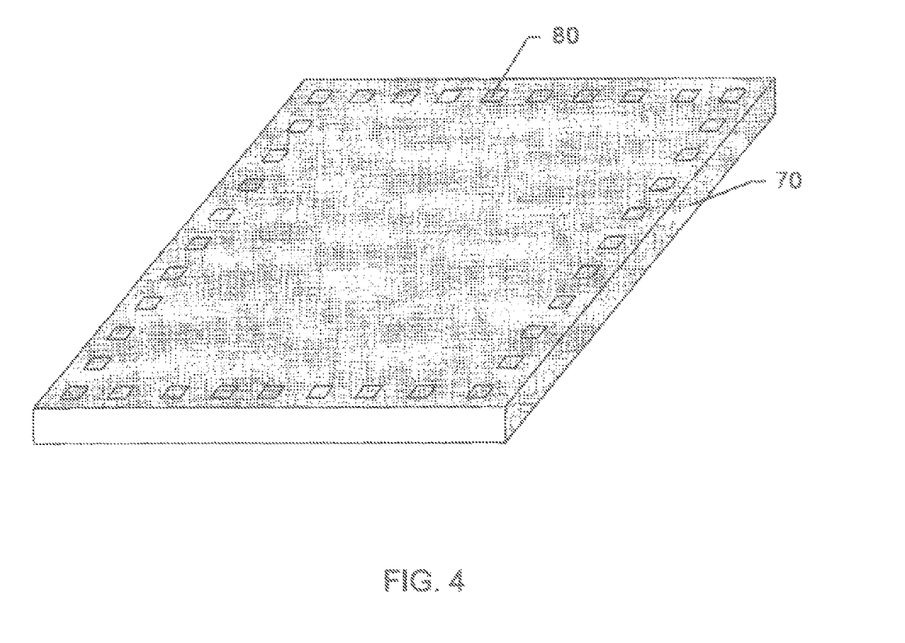
FIG. 4 shows a semiconductor die with connection pads around the periphery of the die.

Referring to FIG. 4, this shows a semiconductor die 70 with connection pads 80 located around the periphery of the die top surface.

Figure 5:
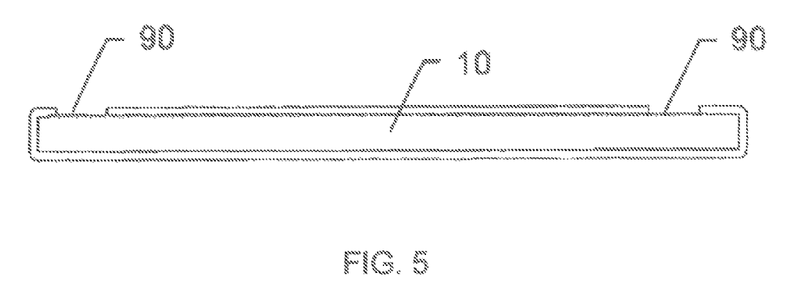
FIG. 5 shows a semiconductor die with peripheral pads, either original or relocated, coated with a conformal insulative coating, and with openings in the insulative coating located above the peripherally located electrical connection pads.

Referring to FIG. 5, this shows openings in the conformal coating material at locations 90 on a semiconductor die whose electrical connections are located at the edges of the surface of the die.

Figure 6:
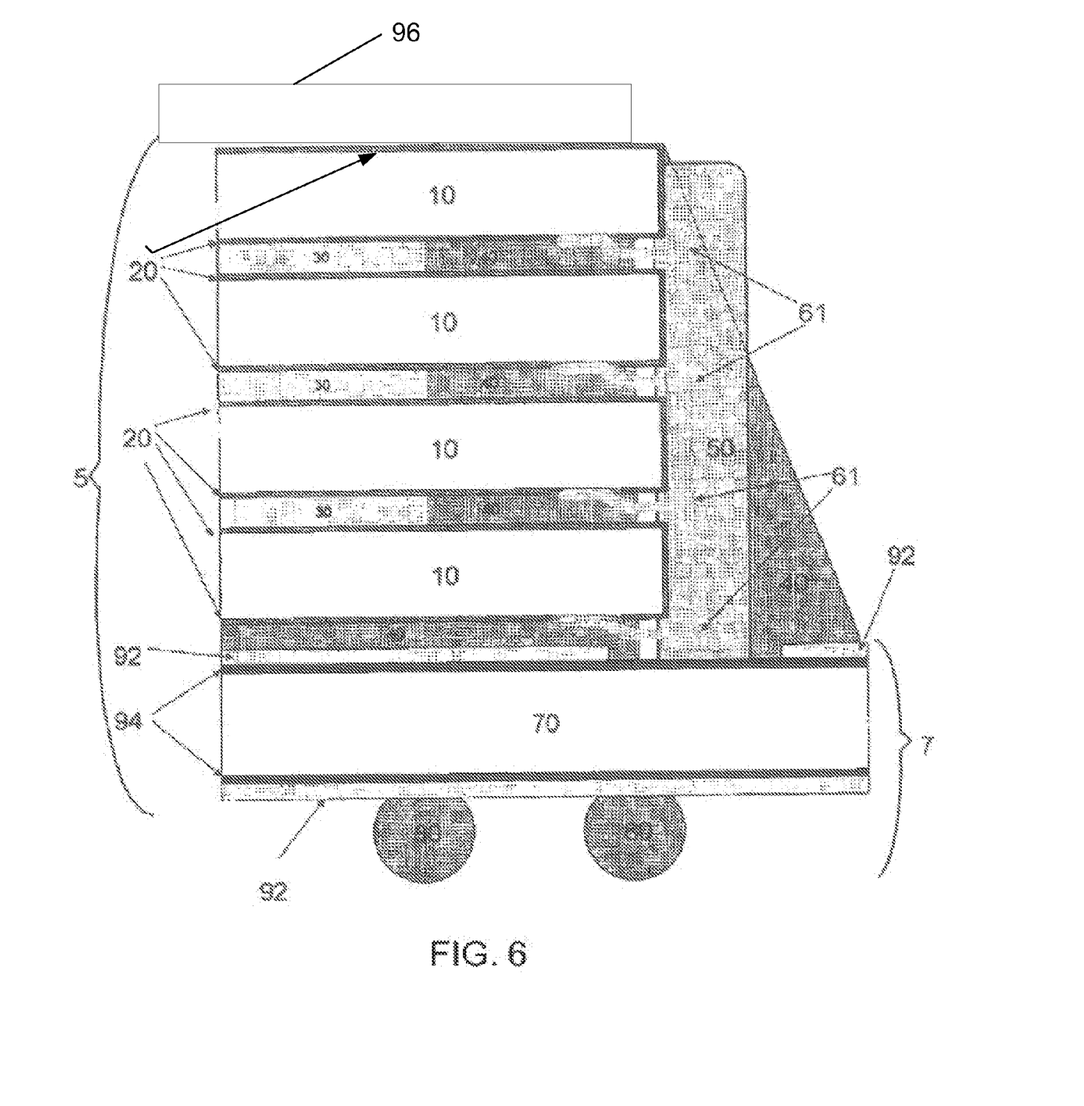
FIG. 6 is a cross section drawing of a completed 4-high stack on BGA.

FIG. 6 depicts the vertical stack assembly component 5, consisting of semiconductor die 10, with conformal coating 20. The semiconductor die 10 having metallic conducting elements 61, one end of which are connected to electrical connection points at the periphery of the die 10, and the other end of the metallic conducting elements are embedded in the vertical conducting polymer 50. The vertical conductive polymer 50 is adjacent to the edge of the stack of the die and electrically connects the die to the top electrical conducting surface, 94, on the substrate 7.

Also shown in FIG. 6 is the epoxy perform 30 used to laminate the die 10 to each other in a stack by bonding to the conformal coating 20 on each of the die.

FIG. 6 shows the stack of die 10 laminated to each other with epoxy perform 30, and connected electrically by horizontal conducting elements 60 to vertical conducting element and mounted on substrate 7. The substrate is shown having conducting layers 94 on its top and bottom surface, a core 70, solder mask 92 on the bottom surface, and solder balls 80 connected to the bottom of the substrate. Additionally, an underfill material 40 has been applied so that it fills the space between the bottom die in the stack and the substrate, 70, forms a filet with the edge of the stack, and fills in the gap between layers from the edge of the perform 30 to the edge of the die.

The foregoing has described a high density, low parasitic stacked die BGA or LGA component assembly. It should be apparent that numerous and various components can be utilized with the present invention, as described below.

For instance, the present invention can comprise a stack of semiconductor or integrated circuit die mounted on a substrate and laminated to each other. The die can optionally have one or more metal rerouting layers to interconnect the original die connection pads with new connection locations at the edge of the top surface of the die. The new connection locations are desirable for vertical interconnection.

The die can have a conformal, insulating coating, where the coating can be a polymer. The polymer coating can parylene, and the insulating coating can have openings above specific new connection locations at the edge of the top surface of the die as required by the specific component design.

The openings can be made, for example, by removing the polymer with laser ablation, and by removing the polymer with a plasma etcher.

The openings can be made by preventing the deposition of the polymer coating in selective areas above connection pads on the die. The die can be laminated on top of each other with an electrically insulating polymer or epoxy preform. The insulating preform can be thermally conductive.

The insulating preform optionally can include spheres to maintain a fixed spacing or separation between the semiconductor die after lamination. The spheres can be made of glass, ceramic, quartz, plastic, Teflon, polymer, or having a metal coating.

The electrically insulating polymer can be an epoxy. The die can be laminated on top of each other with a liquid polymer that is cured to form a solid bond between the layers in the stack. The insulating polymer can optionally include spheres to maintain a fixed spacing or separation between the semiconductor die after lamination, where the spheres can be made of glass, ceramic, quartz, plastic, Teflon, a polymer, and/or a metal coating.

The electrically insulating polymer can consist of epoxy, where the die can be any semiconductor die, such as memory die, where the memory die can be SDRAM, DDR-1, DDR-2, DDR-3, or any other DRAM. The memory die can be NAND Flash, NOR Flash, M-RAM, F-RAM, $E^2$ or any other Non-Volatile Memory. The memory die can be SRAM.

The stack can be electrically connected vertically, where the vertical electrical connection comprises a conductive polymer. The conductive polymer can be a conductive epoxy, such as silver filled (having particles of silver mixed with the polymer), gold filled (having particles of gold mixed with the polymer), the conductive epoxy being filled with metallic particles (having particles of metal mixed with the polymer).

The electrical connection can include one or more metallic conducting elements bonded to the relocated pad locations on the surface of each die and extending, both physically and electrically from the relocated pad into the vertical conductor so that one end of the conductor is embedded within the conductive polymer. The metallic conducting elements can be a bond wire, bond ribbon. The metallic conducting element can be gold, aluminum, copper, or palladium, on any combination of conducting materials such as gold, aluminum, copper, or palladium. The metallic conducting elements can exist as a metal lead frame with tie bars which is bonded to the die, and after which the tie bars of metal are removed to leave individual metal conducting elements or leads bonded to the connection pads on the die. The frame can be formed by excising holes in a thin plate of metal. The frame can be cut to remove a center ring or picture frame, leaving behind metal leads ready to attach to the bonding pads on the die, or the frame can be cut to remove an outer ring or picture frame after the leads have been bonded to the connection pads on the die.

All of the connection pads can be "gang-bonded" simultaneously to the connection pads on the die. The electrical connections can be used selectively to program, or route unique signals to unique layers of semiconductor die within the stack of semiconductor die as required by the specific component design. The electrical connections can be connected to the corresponding connection on one or more other die in the stack to connect signals of each of the semiconductor die in the stack in common, as required by the specific component design. The electrical connections can be fanned out so the similar electrical connections from different die in the stack are available at separate, unique connection points on the module (in other words "not in common").

The mounting of the stack of the semiconductor die to the substrate includes the electrical and physical connection of the vertical interconnects to the aforementioned electrical connection lands on the top surface of said substrate. The electrical connection can be done with the use of a conductive polymer "dot", or "puddle" between the vertical interconnect of the stack of die and the substrate. The mounting of the stack of the semiconductor die to the substrate can include an under-fill adhesive material between the bottom of the lowest die in the stack and the top surface of the substrate. The underfill adhesive material can be an electrical insulating material, a thermally conductive material, where the underfill material can cushion and absorb some of the physical stress that will occur as a result of temperature changes during use of the component. The underfill material can extend past the edge of the bottom die and form a fillet between the bottom die and the substrate. The underfill material can extend above the bottom die to forming a fillet between the side of the stack of die at any point above the substrate and the surface of the substrate. The underfill material can extend above the bottom die to the second, third, fourth, or nth die in the stack of die, or to the top of the stack.

The mounting of the stack to substrate can be with a polymer or epoxy perform between the bottom die in the stack and the substrate. The die in the stack can be "face-up", "face-down", or "face to face". The substrate can have multiple conducting layers for signals, ground, and power supply connections, including one or more conducting layers.

The substrate can include a means for making electrical connection between the bottom of the substrate and a printed circuit board upon which the substrate with stacked die components is attached. The substrate can have solder balls or bumps on the bottom for connection to a printed circuit board. The substrate can have LGA contacts for connection to a printed circuit board, where the contacts have a gold surface, a solder coated surface, a copper surface, an aluminum surface, a conductive surface (a metal surface).

The substrate can have flexible interconnect contacts for connection to a printed circuit board, including flat metallic connection pads (lands) for connection to a printed circuit board or for attachment of solder balls or bumps. The substrate can have electrical connection pads on the top surface for connection to a stack of semiconductor die.

The substrate can have electrical interconnection between the pads on the top surface and the solder ball pad, solder bump pads, or flat connection pads (lands) on the bottom of the substrate. The substrate can be multi-layer, with one or more extra metal layers between the top and bottom conducting layer, and insulated from the top and bottom conducting layer, and insulated from each other for ground planes, power planes, and other signal connections between circuitry on the top layer and circuitry on the bottom layer of the substrate.

A multi layer substrate includes one or more extra metal layers between the top and bottom conducting layers for heat sinking. The substrate, being multi layer, can have one or more extra metal layers above or below the top and/or bottom conducting layers for heat sinking. The substrate can comprise an organic material, such as BT, FR4, polyimide, or kapton.

The substrate can be a flexible substrate, such as a flexible tape, or a flexible film. The substrate can be made from ceramic material, silicon, a chipscale substrate, where the chipscale substrate is less than or equal to 1.2 times the die dimensions.

The assembly can optionally be without any additional coating, molding, or covering over the die, vertical connections, and/or substrate. The top die of the assembly can be covered with a material to block or attenuate light from impinging on and affecting the semiconductor die in the assembly. The assembly can be coated with a conformal polymer, such as parylene, where the conformal coating can be the final coating of the device. The conformal coating can be applied prior to further encapsulation or transfer molding, such as in the cases where the device will be molded or encapsulated.

The assembly can be over-molded with a polymer, plastic, or epoxy to completely coat and cover the stack of semiconductor die and the top of the substrate, leaving the connections at the bottom of the substrate uncovered and exposed for electrical connection. The assembly can be molded in a polymer, plastic, or epoxy to completely cover and seal the stack of semiconductor die and the top surface of the component. The molding can be a "transfer mold" process. The assembly can be covered by a heatsink 96, or in a hermetic package.

The stacked die BGA component is suitable for high speed circuitry due to the component having low inductance, low capacitance, low DC resistance, and/or matched AC Impedance. The component optionally can have ground and power planes included in the substrate and or the die.

Further variations and combinations of the examples shown herein can be made in accordance with the scope and spirit of the invention disclosed herein. The present application is intended to encompass all such variations and combinations of examples permitted by the disclosure herein.

What is claimed is:

1. A semiconductor die assembly, comprising:
   a die stack comprising a first die mounted on a substrate and at least one additional die stacked over said first die mounted on said substrate, said first die and each said additional die having a plurality of peripheral electrical connection sites arrayed in a row near and generally parallel to a peripheral edge of said die, at least one die selected from said first die and said at least one additional die being a memory die, and dielectric spacers maintaining a fixed spacing between the at least one additional die and the first die, and a conducting element electrically connected to at least one of said peripheral electrical connection sites on at least one of said die and extending from said at least one peripheral electrical connection site toward said peripheral die edge on said at least one of said die; and
   the substrate having an electrical connection land at a die mount side thereof, wherein
   said at least one of said peripheral electrical connection sites is electrically connected to said electrical connection land on said substrate by an electrically conductive polymer element applied to a side of said die stack adjacent said peripheral die edge, said electrically conductive polymer element contacting said conducting element and being electrically connected to said land.

2. The assembly of claim 1, wherein adjacent die of the first die and the at least one additional die are attached to one another with an electrically insulating material.

3. The assembly of claim 2, wherein the spacers are disposed in the electrically insulating material between the adjacent die.

4. The assembly of claim 2, wherein the spacers include spheres.

5. The assembly of claim 4, wherein the spheres include spheres made of glass, ceramic or quartz.

6. A semiconductor die assembly, comprising:
   a die stack comprising a first die mounted on a substrate and at least one additional die stacked over said first die mounted on said substrate, said first die and each said additional die having a plurality of peripheral electrical connection sites arrayed in a row near and generally parallel to a peripheral edge of said die, and a conducting element electrically connected to at least one of said peripheral electrical connection sites on at least one of said die and extending from said at least one peripheral electrical connection site toward said peripheral die edge on said at least one of said die; the substrate having an electrical connection land at a die mount side thereof, wherein
   said at least one of said peripheral electrical connection sites is electrically connected to said electrical connection land on said substrate by an electrically conductive polymer element applied to a side of said die stack adjacent said peripheral die edge, said electrically conductive polymer element contacting said conducting element and being electrically connected to said land; and
   a heatsink covering the die stack.

7. The assembly of claim 6 wherein said conducting element extends into the electrically conductive polymer element.

8. The assembly of claim 6, said additional die and said first die mounted on said substrate comprising a plurality of die;
   wherein said at least one interconnection site on at least a first one of said plurality of die is electrically connected to said at least one interconnection site on at least a second one of said plurality of die by an electrically conductive polymer element applied to a side of said die stack adjacent said peripheral edge,
   said electrically conductive polymer element contacting a said conducting element electrically connected to said at least one interconnection site on each of said plurality of die.

9. The assembly of claim 6 wherein said peripheral interconnection site on any one of more of said die comprises an original peripheral die pad.

10. The assembly of claim 6 wherein any one of more of said die is rerouted to connect original die pads to peripheral interconnection sites.

11. The assembly of claim 6, further comprising an electrical insulator between any one of more of said die and the electrically conductive polymer element.

12. The assembly of claim 6 wherein the electrical insulator comprises a conformal coating.

13. The assembly of claim 12 wherein the conformal coating has openings above selected ones of the interconnection sites.

14. The assembly of claim 6 wherein the electrically conductive polymer element is oriented generally perpendicular to the die mount side of the substrate.

15. The assembly of claim 6 wherein said conducting element comprises a lead frame lead.

16. The assembly of claim 6, further comprising an underfill between said first die and said substrate.

17. The assembly of claim 6, wherein said substrate comprises a multi-layer substrate.

18. The assembly of claim 17 wherein said multi-layer substrate comprises a heat sinking layer.

19. The assembly of claim 18 wherein said heat sinking layer is a metal layer.

* * * * *